United States Patent [19]

Shah

[11] Patent Number: 5,282,212
[45] Date of Patent: Jan. 25, 1994

[54] ALGORITHM FOR IDENTIFYING HIGHLY SUSPECT COMPONENTS IN FAULT ISOLATION

[76] Inventor: Rasiklal P. Shah, 8 Windlass Dr., Latham, N.Y. 12210

[21] Appl. No.: 635,037

[22] Filed: Dec. 28, 1990

[51] Int. Cl.$^5$ .................. G01R 31/28; G06F 11/00
[52] U.S. Cl. ............................ 371/15.1; 371/20.1
[58] Field of Search ............ 371/15.1, 20.1, 20.6, 371/20.5; 395/916, 917

[56] References Cited

PUBLICATIONS

Goldman et al., "Integrated fault Management in interconnected Networks", Integrated Network Management.
B. Meandzija and J. Westcott (Editors), Elsevier Science Publishers B.V. (North-Holland), IFIP, 1989, pp. 335-345.
Cantone et al., "IN-ATM TM : Fault Diagnosis as Expert System Guided Search", paper to appear in Computer Expert Systems, L. Boleand, M. J. Coombs (eds), Springer-Verlag, Heidelberg, 1987.
Pipitone, "The FIS Electronics Troubleshooting System", Computer 19 (1986) pp. 120-128.
Ben-Bassat et al., "AI-Test A Real Life Expert System for Electronic Trouble-Shooting (A Description and a Case Study)", Proceedings of the Fourth Conference on Artificial Intelligence Applications, San Diego, 1987, pp. 2-10.
de Kleer et al., "Diagnosing Multiple Faults", Artificial Intelligence, 32 (1987) 97-130.
Tong et al., "Diagnosing An Analog Feedback System Using Model-Based Reasoning", to appear in Proceeding of the 1989 AI Systems in Government Conference, Washington, D.C.
Sussman et al., "Constraints—A Language for Expressing Almost-Hierarchical Descriptions", Artificial Intelligence, vol. 14, (1980) pp. 1-39.

Primary Examiner—Hoa T. Nguyen

[57] ABSTRACT

The present invention, in one embodiment, is a method for identifying highly suspect components in fault isolation. The method for identifying highly suspect components of a system wherein faulty operation has been indicated, respective components of the system generating respective error codes upon occurrence of faulty operation, includes the steps of identifying loops/strings of components, each loop/string being composed of at least one component which generated an error code, determining whether any of the loops/strings have common components, and identifying any of the common components as highly suspect components.

11 Claims, 8 Drawing Sheets

SYSTEM

COMPONENT A

ALGORITHM FOR IDENTIFYING HIGHLY SUSPECT COMPONENTS IN FAULT ISOLATION

RELATED APPLICATIONS

The present application is related to commonly assigned U.S. patent application Ser. Nos. 07/635,450, 07/635,085, 07/635,040, and 07/635,442, respectively entitled AN ALGORITHM FOR REPRESENTING COMPONENT CONNECTIVITY, AN ALGORITHM FOR FAULT ISOLATION, AN ALGORITHM FOR IDENTIFYING COMPONENTS OF A LOOP/STRING, and AN ALGORITHM FOR IDENTIFYING TESTS TO PERFORM FOR FAULT ISOLATION, all of which are concurrently filed herewith.

BACKGROUND OF THE INVENTION

1. Field of the Invention

The present invention is related to processes for fault isolation and, more particularly, relates to a method which may be used as part of a fault isolation process for facilitating faster and more accurate fault isolation.

2. Related Art

Fault isolation typically refers to the process of identifying a faulty component(s) in a system. An engineer typically performs the isolation, possibly with the aid of an automated system. More specifically, when a problem with machinery is detected, a customer typically contacts a service office, and the service office dispatches an engineer to the customer location. The engineer then performs a series of tests in an attempt to isolate the fault. The sequence of testing and the components actually tested usually are determined by the engineer. The amount of time required to isolate the fault and the accuracy of the fault isolation therefore are highly dependent upon the experience and skill of the engineer, and on the complexity of the machinery.

In large and complex systems, components which compose the system typically include respective electronic sensors and respective error detection units. The respective error detection units generate respective error codes when respective sensors detect abnormalities. The error codes are sometimes referred to herein as fault codes, fault messages, error messages, etc. The error codes alert an operator as to potential faulty conditions within the system, and each error code, for example, corresponds to a specific condition or set of conditions, e.g., "temperature of the system is above normal". Analysis of a listing, e.g., a print-out listing or display, of these error codes typically is the starting point for the engineer.

Isolating faulty components of a complex system composed of many components, e.g., thousands of components, can be a very time consuming and difficult task. In an effort to reduce the amount of time necessary for fault isolation, expert systems have been used in fault isolation processes. In general, the effectiveness with which an expert system can isolate a fault improves with an increase in the number of symptoms or initial data available about the problem. If the number of symptoms becomes large for a specific malfunction or if extraneous information caused by side-effects of the real problem are introduced, however, the information must be filtered prior to analysis. Even subsequent to filtering, many error codes may remain. Modeling the rules and logical connections in an expert system in view of the large number of possible error codes is an astronomical task. Even if the rules could be modeled in an expert system, the response time of the expert system may be too slow and the diagnostic quality may not be high as a result of the complexity involved in creating and processing the rule model. Maintenance and future enhancements of such expert systems also poses difficulties.

Although automation techniques are believed to have great utility in fault isolation, there exists a need for a system which is simple yet provides accurate fault isolation, even in the presence of generation of a large number of error messages/codes.

Further, in order to reduce the amount of time required by an engineer to perform fault isolation, it would be desirable to provide an automated system which can utilize the error code listing to identify tests which the engineer should perform in fault isolation. Preferably, the tests would be identified before the engineer arrived at the site so that upon arrival, the engineer immediately could begin testing operations to isolate the fault.

SUMMARY OF THE INVENTION

The present algorithm for identifying highly suspect component in fault isolation includes the step of labeling the components of the system so that the connectivity of the system components is represented. Upstream and downstream components are then identified so that loops/strings of components including the components which generated the error code are identified. Then, if more than one loop/string has been identified, any components which are common to the identified loops/strings are determined and labeled as highly suspect components. Subsequent to identification of the highly suspect components, tests preferably should be performed on the highly suspect components before proceeding to perform other tests, if necessary, on other components.

BRIEF DESCRIPTION OF THE DRAWINGS

These and other objects of the present invention, together with further features and advantages thereof, will become apparent from the following detailed specification when read together with the accompanying drawings, in which.

DETAILED DESCRIPTION OF THE DRAWINGS

The present invention preferably is implemented for practice by a computer, e.g., a source code expression of the present invention is input to the computer to control operations therein. It is contemplated that a number of source code expressions, in one of many computer languages, could be utilized to implement the present invention, and no one particular expression is preferred at this time. A variety of computer systems can be used to practice the present invention including, for example, a personal computer, a work station, etc. The present invention, however, is not to be limited to practice on any one particular computer, and the selection of a particular computer can be made for many reasons.

Figure 1:
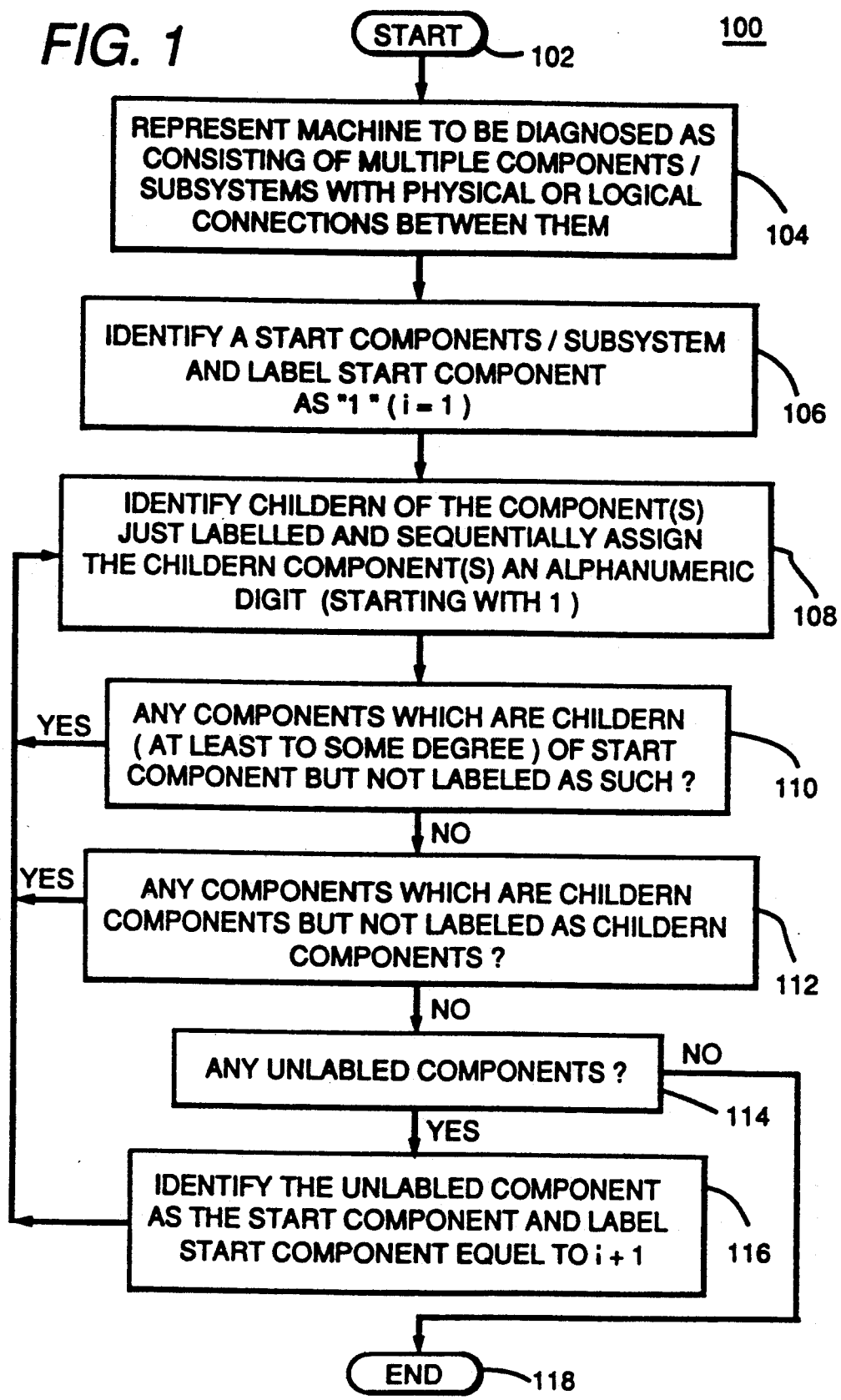
FIG. 1 is a flow chart 100 illustrating a sequence of process steps to be performed prior to processing, i.e., fault isolation, for representing component connectivity.

Referring now more specifically to the drawings, FIG. 1 illustrates an algorithm 100 for representing component connectivity. More particularly, performance of the algorithm 100 results in providing a labelling scheme for assigning labels to components of a system. This labelling scheme facilitates automation of fault isolation processes and is believed to provide a novel representation of component connectivity.

In accordance with the labelling scheme, and subsequent to starting operations as indicated by a start legend 102, the next step 104 is to represent, in diagram form, a machine, or system, to be diagnosed as being composed of multiple components/subsystems with physical or logical connections between them. This step typically is performed by a system developer with the aid of a computer-implemented graphical editor. If the system is relatively simple, it may not be necessary to physically generate such a diagram. More details with regard to generating such a representation are provided hereinafter.

Briefly, subsequent to performing step 104, then a start component is selected, i.e., a start component/subsystem is selected, and the start component is labeled "1" as indicated at step 106. Then, as indicated at 108, children of the component (in the first iteration, children of the start component) just labelled are identified and the children are sequentially assigned an alphanumeric digit starting with 1. Then, as indicated at 110, it is determined whether any components which are children, at least to some degree, e.g., great-great grandchildren, have been labelled as children. If such components have not yet been so labeled, then operations return to step 108. If all the children components have been labeled as children components, then operations proceed to step 112. More particularly, at step 112, it is determined whether any component which is a child component of any other component has been labeled as such. If such a component has not been labeled as a child component, then operations return to step 108. If all the children components have been labeled as children components, then it is determined whether any components are unlabeled as indicated at step 114. If some components are unlabeled, then an unlabeled component is selected as the start component and the new start component is labeled as (i+1) as indicated at step 116. Operations then return to step 108. If all the components are labeled, then operations end as indicated by the end legend 118.

Figure 2:
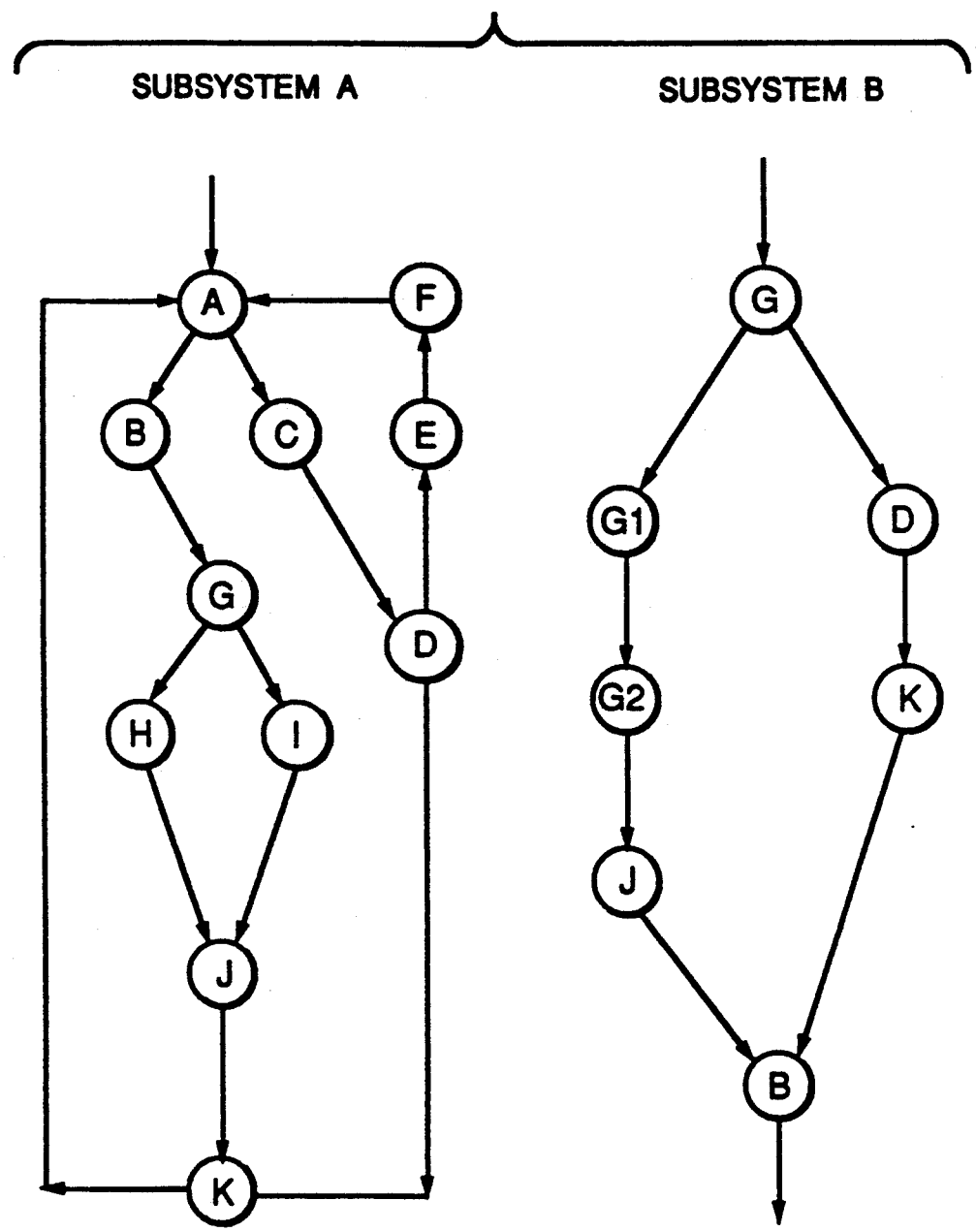
FIG. 2 is an illustration of a connection diagram for a first system.

To illustrate the levels of detail which may be selected to represent a system as required by step 104, FIG. 2 illustrates a system including two subsystems, i.e., subsystem A and subsystem B. Note that some of the components, e.g., component K, are included in both the representation of subsystem A and subsystem B. The level of representation detail of components in the respective subsystems typically is selected by a designer/developer. For example, a resistor can be represented as a component of a subsystem or the resistor can actually be a sub-component of a larger component represented in the diagram. Each component of each subsystem is represented by a circular block and designated by an alphanumeric legend. It should be understood, however, that each circular block could represent an entire subsystem and could be broken down into a further representation.

Figure 3A:
FIGS. 3A-B illustrate, at different levels, connection diagrams (or components thereof) of the diagram illustrated in FIG. 2.
Figure 3B:
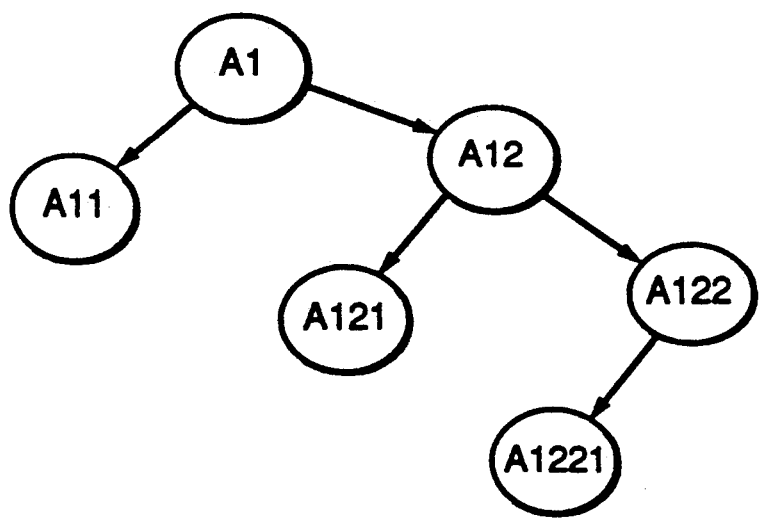

For example, in FIGS. 3A and 3B, different levels of system diagrams are illustrated for the diagram illustrated in FIG. 2. FIG. 3A, more particularly, is a higher level representation of the system illustrated in FIG. 2. In FIG. 3A, the system is illustrated as having two subsystems, i.e., subsystems A and B. This is a relatively high level representation of the system. FIG. 3B, on the other hand, is a detailed representation, i.e., a lower level representation, of component A of subsystem A from FIG. 2. It is possible, of course, to provide such low level detail for other components. As shown in FIG. 3B, component A is composed of many sub-components.

Although it is believed that the lower level representation of components facilitates more accurate isolation of a fault, one trade-off is that more processing time may be required to process a graph of such low level detail. For example, from the diagram in FIG. 3B, it may be possible to isolate a fault to sub-component A1221 of component A of subsystem A whereas when using the diagram in FIG. 3A, it may only be possible to isolate the fault to somewhere within subsystem A. The processing time required to isolate the fault to sub-component A1221 may be greater than the time required to determine that the fault is generally within subsystem A. The level of representation to be utilized is determined on a case-by-case basis with these trade-offs in mind.

Another factor to be considered when generating a diagram is to determine which respective components generate respective error codes. It is preferred that each component which generates an error code be represented in the diagram as a single component. If a component does not have the capability, e.g., a sensor and an error detection unit associated therewith, to generate at least one error code, then the component can be represented in the diagram as part of another component.

For example, in a large system composed of fifty components, assume components B and C are coupled in series. If both components B and C have the capability to generate respective error codes, then components B and C could be represented in the diagram as respective, independent components. A logical connector between components B and C, of course, would be provided. On the other hand, if only component B has the capability to generate at least one error code, then for purposes of the diagram representation, components B and C can be represented as a single component. The usefulness of making such combinations, of course, must be determined on a case-by-case basis. It certain situations, of course, it may be desirable to represent a component as independent even if the component does not generate error codes. For example, if the component has a high probability of failure, it may be desirable to represent the component as an independent component. A cable connecting two components, for example, may be represented as an independent component with its own label if the cable has a high probability of failure.

Figure 4:
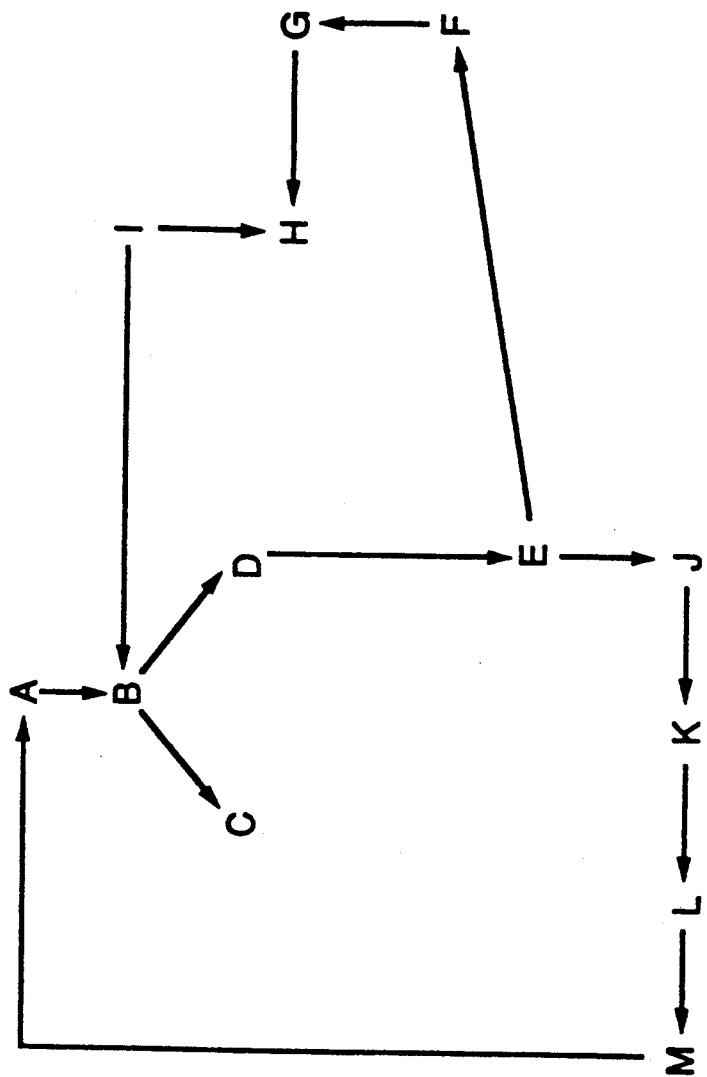
FIG. 4 is an illustration of a connection diagram for a second system.

FIG. 4 is an intermediate level representation of a system and includes components represented as components A to M. In accordance with the algorithm 100, the following labels would be assigned to the respective components:

TABLE 1

| COMPONENT A | 1        | 112121111 |
|-------------|----------|-----------|
| COMPONENT B | 11       | 112111111 |
| COMPONENT C | 111      |           |
| COMPONENT D | 112      |           |
| COMPONENT E | 1121     |           |
| COMPONENT F | 11211    |           |
| COMPONENT G | 112111   |           |
| COMPONENT H | 1121111  |           |
| COMPONENT I | 11211111 |           |
| COMPONENT J | 11212    |           |
| COMPONENT K | 112121   |           |
| COMPONENT L | 1121211  |           |
| COMPONENT M | 11212111 |           |

More specifically, and with reference to TABLE 1, component A was identified as the start component (although any other component could have been selected) and component A was assigned the label "1". Component B is a child of component A and was assigned (in accordance with step 108) the label "11". Components C and D, respectively, are children of component B and were assigned the labels "111" and "112", respectively. A trace through all the components was accordingly generated.

Note that component A, in addition to the label "1", also is labelled "112121111". This label represents the link from component M to component A. More specifically, in addition to being the start component, component A is a child of component M. Similarly, component B has a second label "112111111" which represents that in addition to being a child of component A (as indicated by the label "11"), component B is a child of component I.

The foregoing component labelling scheme provides the advantage that in addition to generating unique labels for each component, the connectivity between the components is represented. The connectivity representation, as described hereinafter in more detail, is important in fault isolation. It should be understood, of course, that fault isolation as described herein is not limited to practice with the connectivity representation generated in accordance with the algorithm 100, although such connectivity representation is preferred.

The component connectivity representation generated in accordance with the algorithm 100 is stored within the memory of a computer system to be used to perform the fault isolation. Although it is contemplated that the process of representing the system to be monitored, e.g., creation of the connection diagram, and the assignment of labels may be automated, such processes may be carried out by a human (e.g., with the assistance of a computer) and then entered into the computer memory by a computer system developer. It is preferred that the labeling process illustrated in FIG. 1 be performed off-line and not at the time of fault isolation. Otherwise, the time required to perform the process of actual on-line fault isolation is increased by time required to generate such a diagram and labels.

Also prior to processing, it is preferred that a computer system developer store, within the memory of the computer, pre-defined tests which can be performed on various system components, the results of each test, of course, being verifiable. Along with each test, it should be indicated in a component field corresponding to a respective test field which components each test can be used to determine whether the components are operating properly. For example, one test, e.g., TEST 1, may be to apply five volts to component D and to measure the voltage output at component H. If the voltage output at component H is three volts, then it is correct to assume that components D, E, F, G and H are operating properly. This assumption, of course, may be retracted as a result of further tests. TABLE 2 illustrates how such test data could be stored in an electronic table created within the memory of the computer.

TABLE 2

| TEST IDENTIFICATION FIELD | COMPONENT FIELD |
|---------------------------|-----------------|
| TEST 1                    | D,E,F,G,H       |
| TEST 2                    | A,I,G,L,K       |
| TEST 3                    | M,A,B,C         |
| TEST 4                    | G,H             |
| etc.                      |                 |

According to TABLE 2, performance of TEST 1 will verify whether components D, E, F, G and H are properly operating, performance of TEST 2 will verify whether components A, I, G, L and K are properly operating, and so on.

Also prior to processing, and in addition to the test and component label hook-up tables, a component-error code correlation look-up table should be generated. More particularly, and as previously stated herein, components represented in the connectivity diagram, in operation, generate error/fault codes/messages. It is necessary to store all the possible error codes as well as the identity of each component which generates each respective error code in a look-up table. TABLE 3 illustrates how such correlation data could be stored in an electronic table created within the memory of the computer.

TABLE 3

| ERROR CODE FIELD | COMPONENT WHICH GENERATES ERROR CODE FIELD |
|------------------|--------------------------------------------|
| 01000            | A                                          |
| 00105            | B                                          |
| 08906            | G                                          |
| etc.             |                                            |

According to TABLE 3, component A generates the error code 01000, component B generates the error code 00105, and so on. It should be understood, of course, that one component may generate multiple error codes, and each such error code should be included in the table.

The component label, test and component-error code correlation look-up tables, of course, could be combined in a single look-up table. Further, electronic storage techniques other than look-up tables, e.g., object diagrams, could be utilized for storing the information so that the information is accessible during processing.

Figure 5:
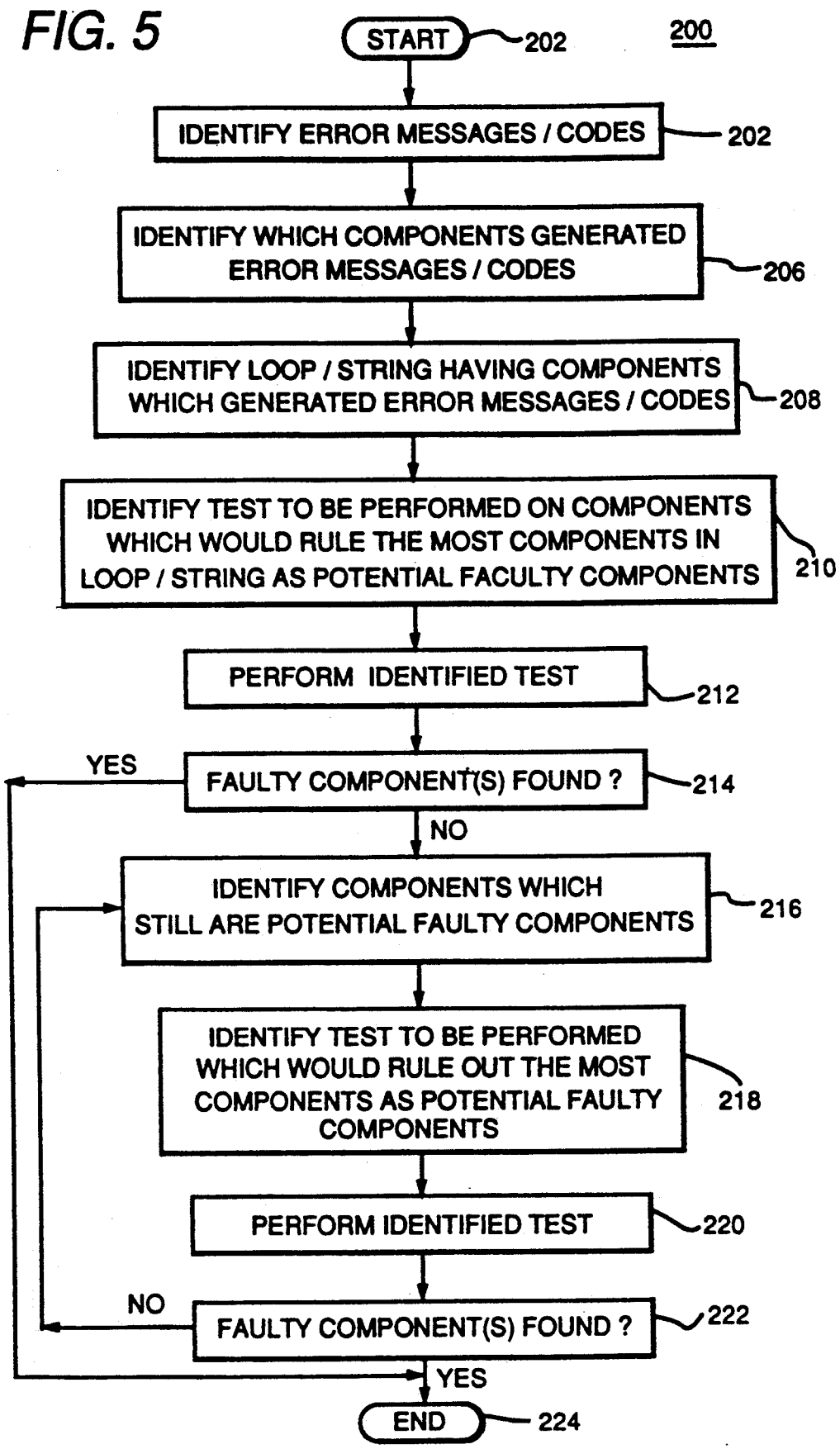
FIG. 5 illustrates a flow chart describing an algorithm for isolating a fault.

Subsequent to performing the above described pre-processing steps, then the algorithm 200 for isolating a fault, as represented in FIG. 5, can be performed. Particularly, as a system is operating, and if a system malfunction occurs, one component or many components within the system may generate error message(s)/code(s). Generation of an error message/code triggers activation of the algorithm 200.

More specifically, rather than being performed at the system site, electronic communication between the system and a computer having the algorithm 200 implemented therein can be established, for example, via telephone lines using well-known techniques. The algorithm 200, therefore, can be practiced at a central location and used to isolate faults for many respective systems at respective sites. The algorithm 200, of course, may also be implemented on the site computer.

Briefly, to communicate the error code and activate the algorithm 200 so that fault isolation is performed at the remote location, when an error code is generated by the system, it is read into a predesignated memory location or register of a computer coupled to the system at the system site, i.e., the site computer. When data is present in the predesignated memory location, the site computer establishes communication with a central computer via a telephone link and respective modems. The central computer is at the remote location, and once communication is established between the central computer and the site computer, the central computer automatically reads the predesignated memory, location of the site computer. In this manner, the error code data is copied into the central computer memory. Once the error code data is copied into the central computer memory, the algorithm 200 is triggered and operates on the data stored in the central computer memory. Such computer network systems are well known in the art.

As a result of performance of the algorithm 200, the faulty component is identified or at least a component which most likely is the faulty component is identified. An engineer (or possibly even someone with very little technical training) could then be dispatched to the system site to merely replace the identified faulty component. The engineer therefore does not perform a lengthy fault isolation task on-site, and the system is restored to operation with minimal delay.

Referring now more particularly to the algorithm 200 illustrated in FIG. 5, subsequent to starting operations as indicated by start legend 202, the next step is to identify the error messages/codes as indicated at 204. This operation, for example, typically involves reading the data from the site computer and storing the data within the central computer memory. Once the error messages/codes have been identified, then the next step is to identify the components which generated the error messages/codes as indicated at 206. The component-error code correlation look-up table (see TABLE 3) hereinbefore described as having all the possible error messages/codes and corresponding components therein is utilized to identify which components generated each respective error message/code.

As indicated at step 208, once it is known which component(s) generated error code(s) the next step is to identify a loop/string composed of the components which generated the error messages/codes. Details with regard to how this step may be performed are provided hereinafter. It should be understood, however, that it is preferred that a single loop/string be identified, the single loop/string being composed of all the components which generated the error messages/codes.

For example, and referring to FIG. 4, if components E, F and G each generated an error message, then the loop composed of the components B, D, E, F, G, H, and I is identified. By identifying a loop/string composed of all the components which generated the error messages/codes and possibly some components which did not generate an error message/code, it is highly probable that in most situations, the actual faulty component(s) are included within the loop/string. Particularly, although a first component which generates an error message/code may not necessarily be the actual faulty component, it is highly probably that a second component which is coupled, either directly or through other components, as an input to the first component is the actual faulty component.

In some situations, of course, it is possible that all the components which generated the error messages/codes cannot be disposed in one loop/string. In this situation, then it may be necessary to identify a plurality of strings/loops of components having the components which generated error messages/codes therein. When a plurality of strings/loops are identified, the algorithm 500 illustrated in FIG. 8 and hereinafter described in detail can be utilized to identify highly suspect components. On the other hand, if such highly suspect components cannot be identified or turn out to be operating properly, then the strings/loops can be prioritized for testing. For example, the string/loop having the highest number of potential faulty components can be given the highest priority for performing fault isolation tasks whereas the string/loop having the lowest number of potential faulty components can be given a lowest priority for performing fault isolation tasks. Other considerations such as the costs associated with setting up tests for each string/loop, failure probability of each string/loop as determined through experience/experimentation of each string/loop, etc., may be factors (sole or joint) in selecting priorities.

Subsequent to identifying the loop/string, and as indicated at step 210, a test to be performed on components which would rule out the most components in the previously identified loop/string (step 208) is determined. More details regarding test identification are provided hereinafter. Briefly, by eliminating as many components from the loop/string as potential faulty components, the time required to isolate the actual faulty component(s) is reduced, assuming that each test requires about the same amount of time for performance. If there is a difference in factors such as the amount of time required to perform each test, costs, etc., such factors can be taken into consideration as hereinafter described. Once the test is identified, then the identified test is performed as indicated at step 212.

Subsequent to performance of the test, if the faulty component is not found as indicated at 214, then the next step is to identify the components which are still potential faulty components as indicated at step 216. Particularly, if the just-performed test does not result in verifying whether all the components of the string/loop are operating properly, then the components which still are potentially faulty components should be identified. For example, if the identified loop is composed of the components B, D, E, F, G, H, and I, and if the first test performed verified that components D, E, G, H, and I are operating properly, then components B and F are the remaining potentially faulty components.

Then, a test which would rule out the most components as potential faulty components is identified as indicated at step 218, and the identified test is performed as indicated at step 220. For example, and referring to the above hypothetical, a test which would verify operation of components B and F, ideally would be performed next. If however, there is no such test but there is a test to verify operation of component B, then that test is performed, for example. If the faulty component still is not found as indicated at a step 222, then operations return to step 216. At step 214 and at step 222, however, if the faulty component has been identified at either of those steps, then operations end as indicated by an end legend 224.

Figure 6:
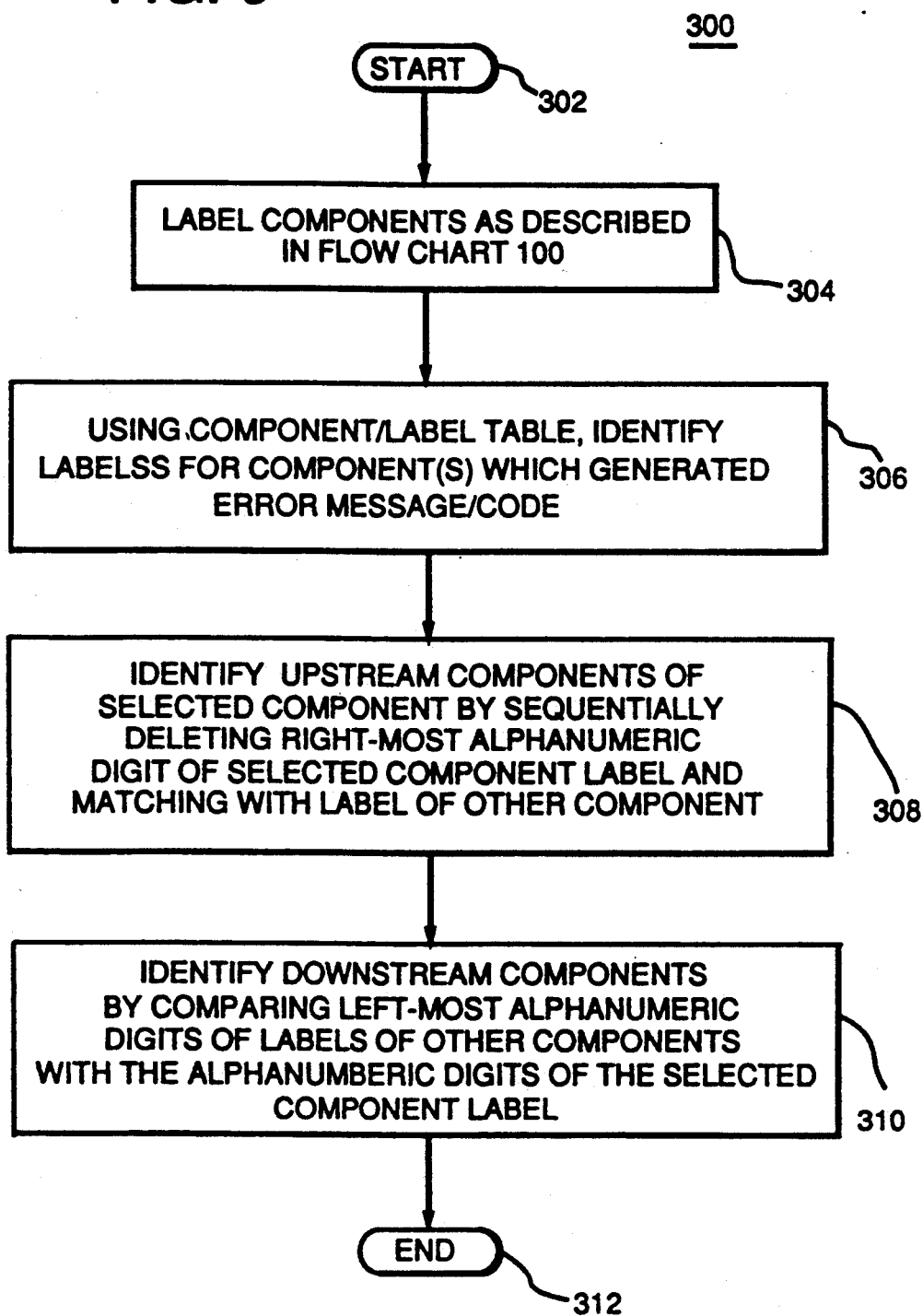
FIG. 6 illustrates a flow chart describing an algorithm for identifying components of a loop/string.

An algorithm 300 for identifying components of a loop/string is illustrated in FIG. 6. As previously discussed, the algorithm 300 can be used to perform step 208 in flow chart 200 (FIG. 5). It should be understood, however, that in many other systems it may be desired to determine components which are members of a loop/string and it is believed that the algorithm 300 illustrated in FIG. 6 can also be used in these other contexts as well. Therefore, although described in a specific context, it should be understood that the algorithm 300 has broad application.

Referring now more specifically to the algorithm 300, subsequent to starting operations as indicated at a start legend 302, the next step 304 is to label components of the system as described in flow chart 100. The labeling scheme results in labeling components such as described with reference to TABLE 1 (reproduced below for ease of reference).

TABLE 1 (REPRODUCED)

| COMPONENT A | 1 | 11212111 |
| COMPONENT B | 11 | 112111111 |
| COMPONENT C | 111 | |
| COMPONENT D | 112 | |
| COMPONENT E | 1121 | |
| COMPONENT F | 11211 | |
| COMPONENT G | 112111 | |
| COMPONENT H | 1121111 | |
| COMPONENT I | 11211111 | |
| COMPONENT J | 11212 | |
| COMPONENT K | 112121 | |
| COMPONENT L | 1121211 | |
| COMPONENT M | 11212111 | |

Step 304, of course, preferably is performed off-line and prior to processing as hereinbefore described. Step 306, on the other hand, may be performed on-line or off-line as hereinafter described. Particularly, once an error message/code has been identified (this step is not illustrated in FIG. 6), then using the error code-component correlation table hereinbefore described, the label(s) for the component(s) which generated the error message/code is identified as set forth at step 306. The component(s) which generated the error message(s)/code(s) are the selected component(s). If a plurality of components generated respective error message(s)/code(s), then steps 308 and 310 would be performed for each such components, or at least until a loop/string was identified which is composed of all the components which generated the error messages/codes.

As indicated at step 308, once a component has been selected, upstream components of the selected component are identified by sequentially deleting the right-most alphanumeric digit of the selected component label and matching with the labels of the other components. For example, assume component G (TABLE 1) is the selected component. The label for component G is 112111. Deleting the right-most digit yields a label 11211. This label matches with component F. Deleting the right-most component again yields a label 1121. This label matches with component E. Deleting again the right-most component yields a label 112 which matches with the label of component D. Again deleting the right-most digit yields the label 11 which matches with the component B. Finally, deleting the right-most digit yields the label 1 which matches with the component A. The upstream components of component G therefore have been identified as components A, B, C, D, E, and F.

The next step is to identify downstream components of the selected component by comparing the left-most alphanumeric digits of labels of other components with the alphanumeric digits of the selected component label as indicated at a step 308. Referring to the above example, again the selected component is component G which has the label 112111. Any component label starting with the identical digits as component G is a downstream component of component G. More particularly, components H (1121111), I (11211111), and B (112111111) are downstream components of component G.

The loop/string for component G, i.e., the selected component, is composed of the identified downstream and upstream components. For component G, therefore, the components are components A, B, C, D, E, F (upstream) and components H, I, B (downstream). Note that component B is identified as both a downstream and as an upstream component. This is because in the labelling scheme, component B was the first component identified in the loop formed by components B, D, E, F, G, H, and I (see FIG. 4). Also, although component A is not physically connected as part of the actual above identified loop, component A is directly linked, as an input, to component B. Therefore, if component A is not operating properly, it is possible that component A could be the cause of the generation of the error message.

Once the downstream components and the upstream components are identified as explained above, the identified components and their corresponding labels should be flagged or copied into a predesignated block of memory for further processing (this step is not illustrated in FIG. 6). Operations then end as indicated at end legend 310. In this manner, the components of a loop/string of which the selected component is a part are identified.

It is contemplated that in order to even further reduce on-line fault isolation processing time, all the possible loops of components could be determined in accordance with the algorithm 300 prior to processing. Particularly, each labelled component could be selected, for each iteration, as the selected component for loop identification. All the predetermined loop configurations then could be pre-stored within a designated block of memory. Once it is known which component(s) generated the error code(s), then a simple comparison operation, i.e., comparing the labels of components which generated error codes with component labels of components in the pre-determined loops, could be performed to identify the component loop.

For example, a plurality of loops such as illustrated in TABLE 4 would be stored within the memory of the central computer prior to fault isolation.

TABLE 4

| LOOP # | COMPONENTS |
|---|---|
| LOOP 1 | A, B, C, D, E |
| LOOP 2 | B, D, E, F |

TABLE 4-continued

| LOOP # | COMPONENTS |
|---|---|
| LOOP 3 | D, E, G |

Then assume that during operation, components E and F generate error codes. By matching the components which generated error codes with the components which compose all the possible loops, LOOP 2 would be selected as the loop for further processing. Particularly, LOOP 2 is the only loop which has all the components which generated error codes therein.

It should be understood, of course, that other factors also can be taken into consideration for loop selection. For example, and as hereinbefore described, failure probabilities may be associated with each loop. Such probabilities may be determined through experimentation/experience. Even if only one of the components which generated an error code is a component of a pre-determined loop, the failure probability of the pre-determined loop may be so high (e.g., 0.90) as to indicate that the loop should be selected for further processing. Factors such as costs of performing tests on each loop may also be taken into consideration.

Figure 7:
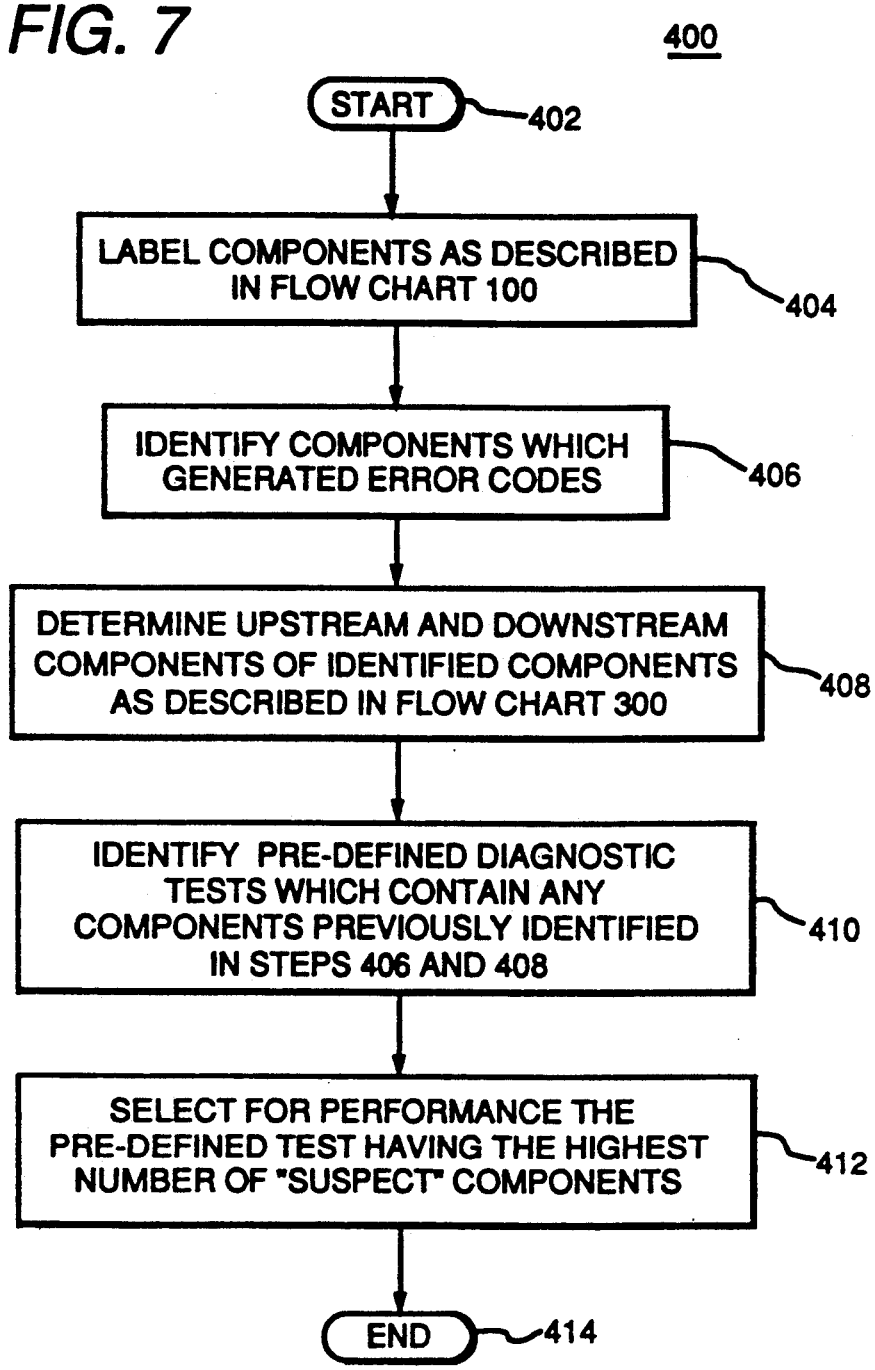
FIG. 7 illustrates a flow chart describing an algorithm for identifying tests to perform for fault isolation.

An algorithm 400 for identifying tests to perform on components of a loop/string is illustrated in FIG. 7. As previously discussed, the algorithm 400 can be used to perform steps 210 and 218 in flow chart 200 (FIG. 5). It should be understood, however, that in many other systems it may be desired to determine tests to be performed on components which are members of a loop/string and it is believed that the algorithm illustrated in FIG. 7 can also be used in these other contexts as well. Therefore, although described in a specific context, it should be understood that the algorithm 400 has broad application.

Referring now more particularly to flow chart 400, subsequent to starting operations as indicated at a start legend 402, the next step 404 is to label components as described in flow chart 100. Step 404, of course, preferably is performed off-line. Then, as indicated at step 406, the next step is to identify components which generated the error codes as hereinbefore described. Upstream and downstream components are then identified as described with reference to the algorithm 300 and as indicated at a step 408. Then, as indicated at step 410, the pre-defined diagnostic tests which contain any components identified in steps 406 and 408 are identified. This information, as hereinbefore described, is pre-stored in a look-up table in the memory of the computer (see TABLE 2).

For example, assume that component Y has been identified as the component which generated an error code, and assume that components X and Z are components which are in a loop with component Y. Also, assume that the following look-up table has been previously stored in the electronic memory of the computer.

TABLE 5

| TEST IDENTIFICATION FIELD | COMPONENT FIELD |
|---|---|
| TEST 1 | X, Q, R, T |
| TEST 2 | F, G, Q, S |
| TEST 3 | W, Y, S, Z |

As set forth in TABLE 5, performing TEST 1 results in verification as to whether components X, Q, R and T are operating properly. If TEST 1, for example, provides a negative result, this means that either one or some combination of components X, Q, R and T are not properly working. Each so designated test, of course, must provide verifiable results.

In accordance with step 410, and for the present example, TESTS 1 and 3 would be identified. Particularly, TEST 1 verifies operation of component X and TEST 3 verifies operation of components Y and Z. TEST 2 does not verify operation of any suspect component.

Then, the next step as indicated at step 412, is to select for performance the predefined test having, for example, the highest number of suspect components therein. Suspect component, by definition and as used herein, means a component which is in a same loop/string as the selected component. In the present example, therefore, the suspect components are components X, Y, and Z. TEST 3 therefore would be selected for performance because performance of TEST 3 would result in verification of two of the suspect components whereas performance of TEST 1 would result in verification of only one suspect component. Performance of TEST 2 would result in verification of no suspect component.

Operations then end as indicated at an end legend 414. It should be understood, of course, and as explained in flow chart 200 in FIG. 5, that the test identification procedure can be repeated as many times as necessary until the fault is isolated, by eliminating, for each iteration, from the list of suspect components, any component which has been determined to be operating properly. The tests can be performed, for example, by an engineer/technician dispatched to the system site. Some of the tests could even be automatically performed, via the telephone communication link, under computer control. The output test values each component should generate under each test procedure could be stored, for example, within the computer memory. The stored values are compared with the actual values in order to verify whether a component is operating properly.

Other schemes for selecting a test to perform, in addition to performing the test having the highest number of suspect component therein, are contemplated. For example, and based upon data gathered through experience/experimentation, failure probabilities may be associated with each component. The failure probabilities associated with loops of components, as hereinbefore described, should be distinguished from the failure probability associated with each component. The component failure probabilities, of course, may be taken into consideration when determining loop failure probabilities. For example, the following look-up table could be stored, prior to processing, in the electronic memory of the central computer.

TABLE 6

| Component | Failure Probability |
|---|---|
| X | 0.86 |
| Y | 0.43 |
| Z | 0.65 |

According to TABLE 6, component X has the highest probability of failure, component Y has the lowest probability of failure, and component Z has an intermediate probability of failure.

A probability value then is associated with each test. Particularly, for each suspect component, a probability of failure value is obtained, and each test is assigned a value which is the same as the value of the highest value of any suspect component verified by the test. If the test does not verify a suspect component, then the test is assigned the lowest possible value, i.e., 0.0.

For example, and referring to TABLES 4 and 5, the suspect components are components X, Y and Z. TABLE 4 is the "test" table and TABLE 5 is the "failure probability" table. TEST 1 results in verification of suspect component X, and TEST 1 does not verify any other suspect components. Therefore, TEST 1 would be assigned a value of 0.86. TEST 2 does not result in verifying any suspect components and therefore, TEST 2 is assigned the value 0.0. TEST 3 results in verifying respective suspect components Y and Z which have respective failure probabilities 0.43 and 0.65. Since 0.65 is higher than 0.43, TEST 3 is assigned a value of 0.65. Other techniques for combining component failure probabilities into a test failure probability, of course, also may be employed. At least conceptually, the following test value assignment table would be created.

TABLE 7

| Test | Value |
|---|---|
| 1 | 0.86 |
| 2 | 0.0 |
| 3 | 0.65 |

According to TABLE 7, since TEST 1 has the highest value (0.86), TEST 1 would be selected for performance.

Rather than assigning quantitative values to the probability of failure, it is contemplated that qualitative values could be used. For example, respective ranges of quantitative values, e.g., 1.0–0.75, 0.74–0.25, and 0.24–0.00, could be assigned respective qualitative values, e.g., "HIGH", "MEDIUM", and "LOW". Further, other factors such as the amount of time required to set up the test, the cost of performing the test, etc. could be taken into consideration, e.g., assigned weights, when selecting a test for performance.

Figure 8:
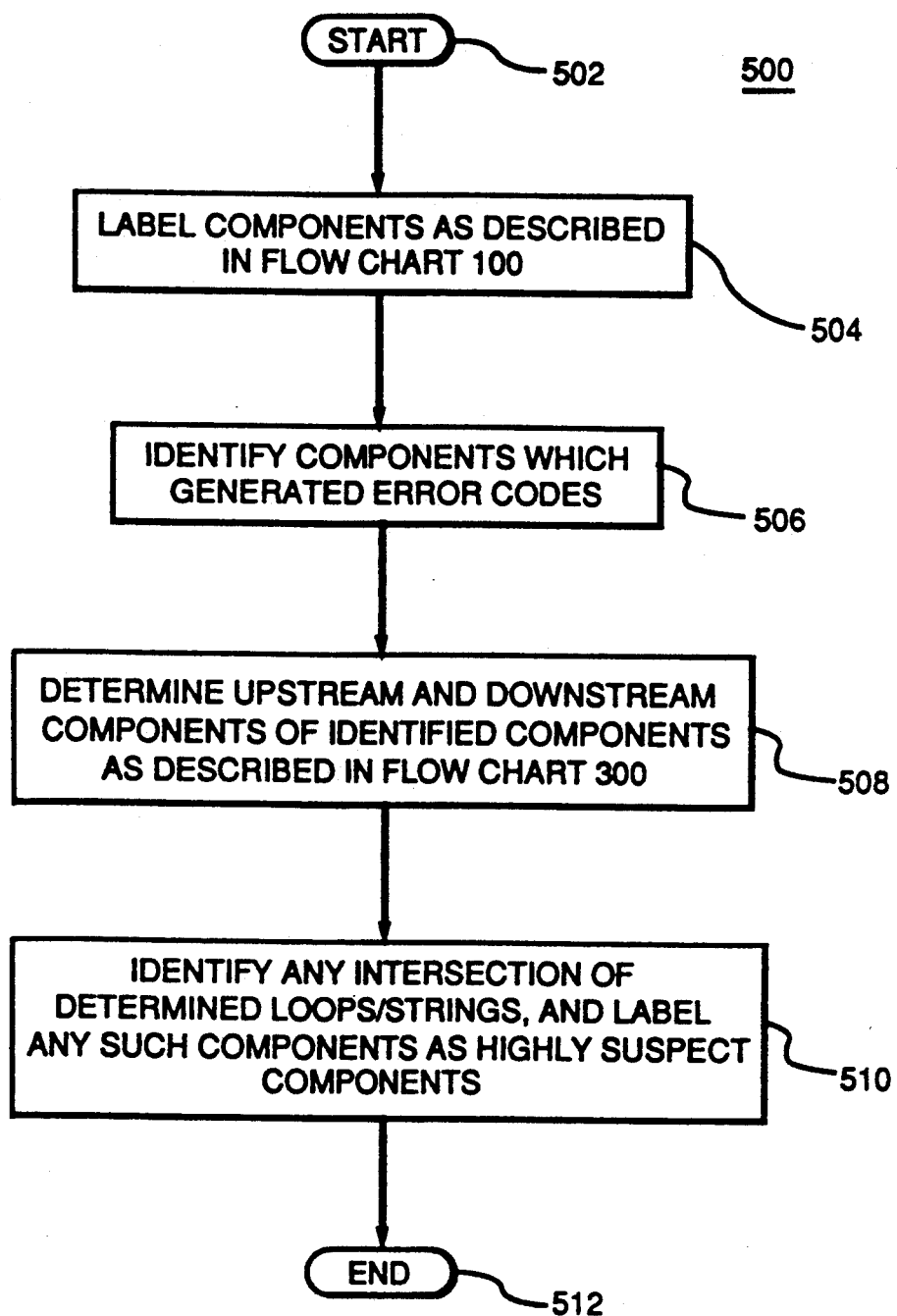
FIG. 8 illustrates a flow chart describing an algorithm for identifying highly suspect components for fault isolation.

FIG. 8 illustrates an algorithm 500 for identifying highly suspect component(s) when more than one loop/string has been identified in order to isolate the faulty component. As hereinbefore described, it may not be possible to identify a single loop having all the potentially faulty components therein. Particularly, with reference to the algorithm 500, subsequent to starting operations as indicated at a step 502, the next step 504 is to label the components of the system as described with reference to the algorithm 100. Step 504, of course, preferably is performed off-line. Then, as indicated at a step 506, components which generated error codes are identified as hereinbefore described. Upstream and downstream components of the identified components are then determined as hereinbefore described and as indicated at step 508. Then, as indicated at step 510, if more than one loop/string has been identified, then any components which are common to the identified loops/strings are determined and labeled as highly suspect components. Operations then end as indicated at an end legend 512. Of course, subsequent to identification of the highly suspect components, test should be performed on the highly suspect components before proceeding to perform other tests, if necessary, on other components.

For example, and for the system illustrated in FIG. 2, the following operations would be performed. Particularly, for the subsystem A, the following labels (step 504) would be generated.

TABLE 8

| | |
|---|---|
| A | 1,121111, 1121111, 1111111, 1112111, 112111, 12111 |
| B | 11 |
| C | 12, 112 |
| D | 121, 1121 |
| E | 1211, 11211 |
| F | 12111, 112111 |
| G | 111 |
| H | 1111 |
| I | 1112 |
| J | 11111, 11121 |
| K | 111111, 111211, 11211, 1211 |

For subsystem A, closed loops and the components involved can be identified in accordance with the algorithm 300 and as illustrated in TABLE 9. All the possible closed loops are identified herein only to facilitate an understanding of the present invention and identification of all the possible closed loops certainly is not a required step for performance of the algorithm 500. Of course, and as hereinbefore explained, all possible loops could be identified off-line in order to reduce on-line processing time.

TABLE 9

| | |
|---|---|
| LOOP (I) | LABELS 1, 121111 |
| | COMPONENT: 121111 (A), 12111 (F), 1211 (E), 121 (D), 12 (C) |
| LOOP (II) | LABELS 1, 1121111 |
| | COMPONENT: 1121111 (A), 112111 (F), 11211 (E), 1121 (D), 112 (C), 11 (B) |
| LOOP (III) | LABELS 1, 1111111 |
| | COMPONENT: 1111111 (A), 111111 (K), 11111 (J), 1111 (H), 111 (G), 11 (B) |
| LOOP (IV) | LABELS 1, 1112111 |
| | COMPONENT: 1112111 (A), 111211 (K), 11121 (J), 1112 (I), 111 (G), 11(B) |
| LOOP (V) | LABELS 1, 112111 |
| | COMPONENT: 112111 (A), 11211 (K), 1121 (D), 112 (C), 11 (B) |
| LOOP (VI) | LABELS 1, 12111 |
| | COMPONENT: 12111 (A), 1211 (K), 121 (D), 12 (C) |

Similarly, for the subsystem B, the labels set forth in TABLE 10 would be generated. Note that the labels are generated in accordance with the algorithm 100 set out in FIG. 1 with the exception that rather than starting each label with the digit "2" to indicate a new start component, each label starts with the character "$" to distinguish this set of components from subsystem A. Other such variations, of course, of the algorithm 100 are contemplated.

TABLE 10

| | |
|---|---|
| G | $1 |
| G1 | $11 |
| G2 | $111 |
| J | $1111 |
| D | $12 |
| K | $121 |
| B | $11111, $1211 |

For subsystem B, no closed loops are present. If, for example, component K ($121) generates a fault signal, the following string of suspect components would be identified in accordance with the algorithm 300 (and particularly, steps 308 and 310):

Components: $1211 (B), $121 (K), $12 (D), $1 (G).

Further by way of example, and during operation, assume that an over-temperature fault condition has occurred, generating an "over-temp" error code for component K. A second failure condition caused by the overtemp situation results in communication loop failures (since component K is common to both subsystems A and B), thereby causing components C and F (components C and F are only in subsystem A) to generate error codes.

The error code information is combined with the component connection pattern data to identify suspect strings of components. Thus, the label for component K ($121) is utilized in accordance with the algorithm 300 (and particularly steps 308 and 310) to identify a suspect string of components: D and G (upstream) and B (downstream). The suspect string of components for subsystem B therefore is G, D, K and B.

Similarly, the components C and F identified by the additional error codes have the labels (12, 112) and (12111, 112111), respectively. By determining the upstream and downstream components for C and F in accordance with the algorithm 300 (and particularly steps 308 and 310), the suspect string (or loop in this case) includes components A, B, C, D, E and F.

In accordance with step 510, by finding the intersection of the suspect string and loop, the common suspect components, i.e., B and D, are identified as the highly suspect components. Tests involving components B and/or D should then be first selected for performance before selecting any other tests for performance. Particularly, it is highly probable that component B and/or D are the actual faulty components.

The present invention facilitates simple, yet accurate, automated fault isolation even in the presence of generation of a large number of error messages/codes. Further, the present invention facilitates identification of the test(s) which should be performed to isolate a fault, and such tests can be determined even before an engineer is dispatched to the system site.

While a preferred embodiment has been illustrated and described herein, it will be obvious that numerous modifications, changes, variations, substitutions and equivalents, in whole or in part, will now occur to those skilled in the art without departing from the spirit and scope contemplated by the invention. Accordingly, it is intended that the invention herein be limited only by the scope of the appended claims.

What is claimed is:

1. A method for identifying highly suspect components of a system wherein faulty operation has been indicated and wherein components in said system generate error codes upon the occurrence of a fault in said component, said method comprising the steps of:
(a) creating a diagram composed of blocks representing components of the system;
(b) representing connectivity of the components on the diagram;
(c) selecting a first start component;
(d) assigning a first label to the start component;
(e) identifying respective children components of the start component;
(f) assigning respective labels to the respective children components of the start component, the respective labels being unique for each component and representing the component connectivity;
(g) selecting another start component if any component connectivity represented in the diagram is not represented by a label subsequent to performance of step (f) and, after selecting a second start component, returning to step (e);
(h) storing the assigned component labels;
(i) upon generation of an error code, determining the component label of the component source of the error code, and designating the component source of the error code as a loop/string component;
(j) identifying upstream components of the loop/string component by sequentially deleting a right-most alphanumeric digit of the loop/string component label thereby generating a match label, and tagging component labels which are identical to said match label as upstream components;
(k) identifying downstream components of the loop/string component by comparing left-most alphanumeric digits of labels of components with alphanumeric digits of loop/string component labels wherein any component label whose left-most alphanumeric digits match the alphanumeric digits of the loop/string component label is tagged as a downstream component;
(l) determining whether any of the loops/strings have common components; and
(m) identifying any of the common components as highly suspect components.

2. A method in accordance with claim 1 wherein the first start component is assigned the label "1" and a variable i is initially equal to "1", and each subsequent start component is sequentially assigned the label (i+1).

3. A method in accordance with claim 1 wherein the children components are sequentially assigned an alphanumeric digit starting with "1" and including the parent component label.

4. A method in accordance with claim 1 wherein the diagram is created on a graphical editor.

5. A method in accordance with claim 1 wherein the component labels are stored within a central computer memory.

6. A method in accordance with claim 1 wherein a component is represented in the diagram as an independent component only if the component is capable of generating an error code.

7. A method for operating a computer for identifying highly suspect components of a system wherein faulty operation has been indicated and wherein components in said system generate error codes upon the occurrence of a fault in said component, said method comprising the steps of:
(a) creating a diagram composed of blocks representing components of the system;
(b) representing connectivity of the components on the diagram;
(c) selecting a first start component;
(d) assigning a first label to the start component;
(e) identifying respective children components of the start component;
(f) assigning respective labels to the respective children components of the start component, the respective labels being unique for each component and representing the component connectivity;

(g) selecting another start component if any component connectivity represented in the diagram is not represented by a label subsequent to performance of step (f) and, after selecting a second start component, returning to step (e);

(h) storing the assigned component labels;

(i) upon generation of an error code, determining the component label of the component source of the error code, and designating the component source of the error code as a loop/string component;

(j) identifying upstream components of the loop/string component by sequentially deleting a right-most alphanumeric digit of the loop/string component label thereby generating a match label, and tagging component labels which are identical to said match label as upstream components;

(k) identifying downstream components of the loop/string component by comparing left-most alphanumeric digits of labels of components with alphanumeric digits of loop/string component labels wherein any component label whose left-most alphanumeric digits match the alphanumeric digits of the loop/string component label is tagged as a downstream component;

(l) determining whether any of the loops/strings have common components; and (m) identifying any of the common components as highly suspect components.

8. A method in accordance with claim 7 wherein the first start component is assigned the label "1" and a variable i is initially equal to "1", and each subsequent start component is sequentially assigned the label (i+1).

9. A method in accordance with claim 7 wherein the children components are sequentially assigned an alphanumeric digit starting with "1" and including the parent component label.

10. A method in accordance with claim 7 wherein the diagram is created on a graphical editor and an electronic data file output from the graphical editor is provided as input to the computer.

11. A method in accordance with claim 7 wherein the component labels are stored within a central computer memory.

* * * * *

UNITED STATES PATENT AND TRADEMARK OFFICE
CERTIFICATE OF CORRECTION

PATENT NO. : 5,282,212

DATED : January 25, 1994

INVENTOR(S) : Rasiklal P. Shah

It is certified that error appears in the above-identified patent and that said Letters Patent is hereby corrected as shown below:

On the title page, item:

--[73] Assignee: General Electric Compapny,
Schenectady, N.Y.--

On page 1, insert under "Primary Examiner--Hos. T. Nguyen

--Attorney, Agent, or Firm--Paul R. Webb, II--

Signed and Sealed this

Twenty-eighth Day of June, 1994

*Attest:*

BRUCE LEHMAN

*Attesting Officer*     *Commissioner of Patents and Trademarks*